United States Patent
Hong

(10) Patent No.: US 9,786,363 B1
(45) Date of Patent: Oct. 10, 2017

(54) WORD-LINE ENABLE PULSE GENERATOR, SRAM AND METHOD FOR ADJUSTING WORD-LINE ENABLE TIME OF SRAM

(71) Applicant: Taiwan Semiconductor Manufacturing Co., Ltd., Hsinchu (TW)

(72) Inventor: Hyunsung Hong, Kanata (CA)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/340,879

(22) Filed: Nov. 1, 2016

(51) Int. Cl.
*G11C 11/418* (2006.01)
*G11C 11/419* (2006.01)

(52) U.S. Cl.
CPC .......... *G11C 11/419* (2013.01); *G11C 11/418* (2013.01)

(58) Field of Classification Search
CPC ........................ G11C 11/419; G11C 11/418
See application file for complete search history.

(56) References Cited

U.S. PATENT DOCUMENTS

| | | | | |
|---|---|---|---|---|
| 5,243,557 A * | 9/1993 | Maeda | ...................... | G11C 8/08 365/174 |
| 5,771,190 A * | 6/1998 | Okamura | .............. | G11C 11/419 365/154 |
| 6,327,213 B1 * | 12/2001 | Ooishi | ..................... | G11C 5/14 365/189.07 |
| 8,605,523 B2 | 12/2013 | Tao et al. | | |
| 8,630,132 B2 | 1/2014 | Cheng et al. | | |
| 8,760,948 B2 | 6/2014 | Tao et al. | | |
| 8,908,421 B2 | 12/2014 | Liaw | | |
| 8,929,160 B2 | 1/2015 | Katoch et al. | | |
| 8,964,492 B2 | 2/2015 | Hsu et al. | | |
| 8,982,643 B2 | 3/2015 | Lum | | |
| 9,117,510 B2 | 8/2015 | Yang et al. | | |
| 9,208,858 B1 | 12/2015 | Lin et al. | | |
| 9,218,872 B1 | 12/2015 | Liaw | | |
| 2008/0037358 A1 * | 2/2008 | Yabuuchi | ............... | G11C 5/147 365/230.06 |
| 2010/0165724 A1 * | 7/2010 | Pellizzer | .................. | G11C 8/08 365/163 |
| 2011/0280097 A1 * | 11/2011 | Bolandrina | .............. | G11C 8/08 365/230.06 |
| 2014/0153345 A1 | 6/2014 | Kim et al. | | |
| 2014/0233330 A1 | 8/2014 | Ko et al. | | |

(Continued)

*Primary Examiner* — Khamdan Alrobaie
(74) *Attorney, Agent, or Firm* — McClure, Qualey & Rodack, LLP

(57) ABSTRACT

A word-line enable pulse generator for a SRAM is provided. A delay unit receives an enable signal to provide an intermediate signal. A first inverter receives the intermediate signal to provide a word-line enable pulse signal to a plurality of word line drivers of the SRAM. The delay unit includes a first transistor coupled between an input terminal of the first inverter and a first power source, a resistor coupled between the input terminal of the first inverter and a second power source that is different from the first power source, and a second transistor coupled between the input terminal of the first inverter and the resistor. The first transistor and the second transistor form a second inverter. A specific edge of the word-line enable pulse signal is delayed from the specific edge of the enable signal by a delay time corresponding to resistance of the resistor.

20 Claims, 9 Drawing Sheets

(56) References Cited

U.S. PATENT DOCUMENTS

2015/0348598 A1 12/2015 Wang et al.
2015/0371702 A1 12/2015 Wu et al.
2015/0380077 A1 12/2015 Wu et al.
2015/0380078 A1 12/2015 Liaw
2016/0111143 A1 4/2016 Lin et al.

* cited by examiner

WORD-LINE ENABLE PULSE GENERATOR, SRAM AND METHOD FOR ADJUSTING WORD-LINE ENABLE TIME OF SRAM

BACKGROUND

Static random access memories (SRAM) are commonly used in integrated circuits. Furthermore, SRAM are used for electronic applications where high speed, low power consumption and simple operation are needed. Embedded SRAM is particularly popular in high-speed communication, image processing and system-on-chip (SOC) applications. SRAM has the advantageous feature of holding data without requiring a refresh.

SRAM includes a plurality of bit cells disposed in rows and columns to form an array. Each bit cell includes a plurality of transistors coupled to bit lines and word lines that are used to read and write a bit of data to the memory cell. Single-port SRAMs enable a single bit of data to be written to or read from a bit cell at a particular time. In contrast, a multi-port SRAMs enables multiple reads or writes to occur at approximately the same time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
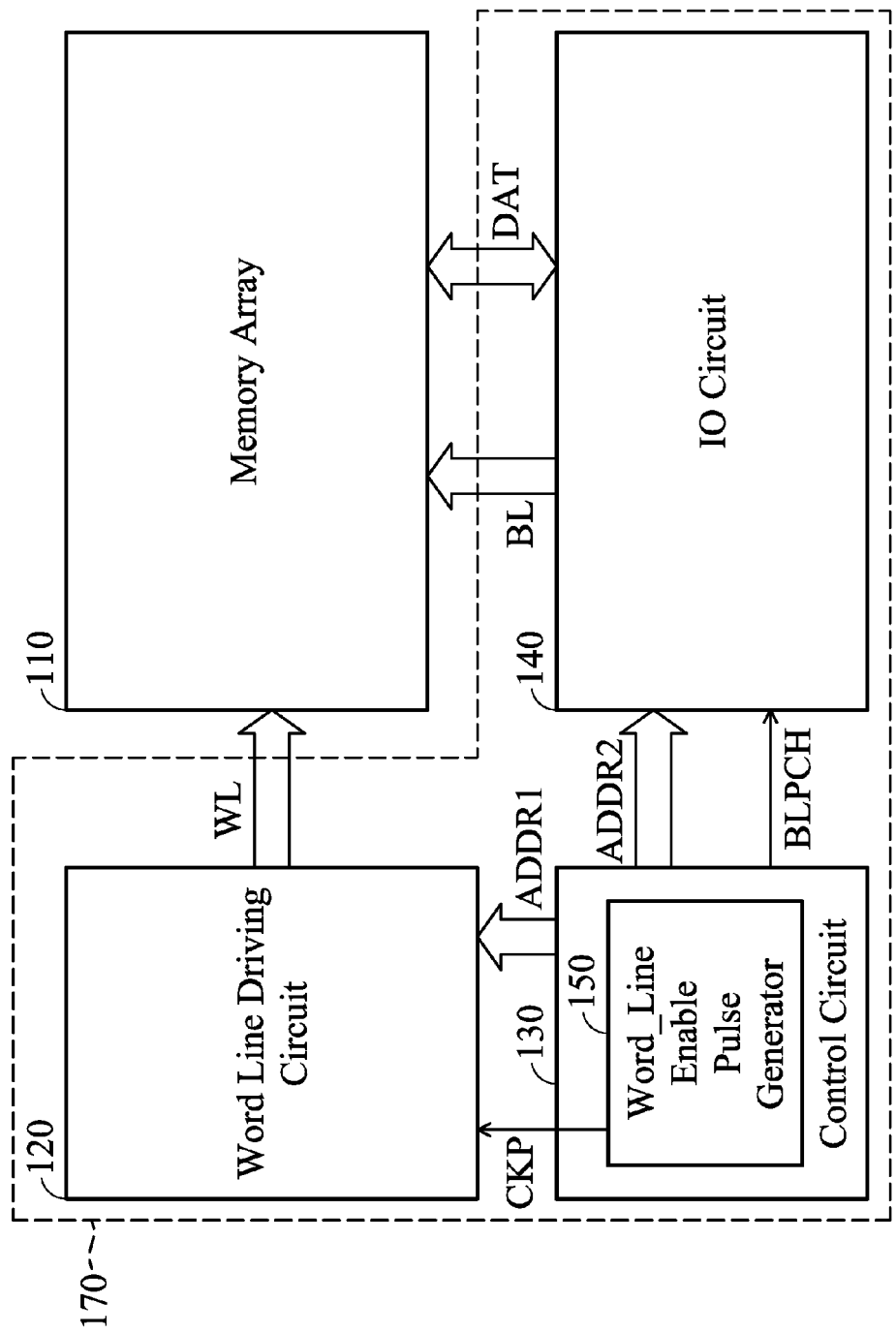
FIG. 1 shows a static random access memory (SRAM), in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

FIG. 1 shows a static random access memory (SRAM) 100, in accordance with some embodiments of the disclosure. The SRAM 100 includes a memory array 110 and an access circuit 170. The access circuit 170 includes various circuits for accessing the memory array 110, such as a row decoder, a column decoder, a sense circuit having a plurality of sense amplifiers, and so on. In order to simplify the description, only a word line driving circuit 120, a control circuit 130 and an IO circuit 140 are illustrated in the embodiment.

The memory array 110 is formed by a plurality of memory cells arranged in a plurality of rows and a plurality of columns. Each memory cell is a bit cell, such as a six-transistor (6T), 8T, 10T cell and so on. Furthermore, the bit cells of the memory array 110 can be accessed by using a plurality of word lines WL from the word line driving circuit 120 and a plurality of bit lines BL from the IO circuit 140. In the memory array 110, each bit cell is capable of storing one-bit data according to the corresponding word line WL and the corresponding bit line BL. The word line driving circuit 120 includes a plurality of word line drivers. Each word line driver is capable of providing an individual word line signal WL to the corresponding memory cells in the memory array 110 according to a word-line enable pulse signal CKP and a pre-decoding address ADDR1 from the control circuit 130. According to information regarding address and command received by the SRAM 100, the control circuit 130 is capable of providing the pre-decoding addresses ADDR1 and ADDR2 and a bit line pre-charge signal BLPCH. For example, in response to the received address, the control circuit 130 can provide the address ADDR1 corresponding to the word lines of the memory array 110 and the address ADDR2 corresponding to the bit lines of the memory array 110 to access the memory cells corresponding to the received address. Furthermore, the control circuit 130 includes a word-line enable pulse generator 150 for providing the word-line enable pulse signal CKP. According to the address ADDR2 from the control circuit 130, the IO circuit 140 is capable of providing a plurality of bit line signals BL to the memory array 110. Therefore, in response to the word line signals WL and the bit line signals BL, data DAT can be read from the corresponding bit cells or written into the corresponding bit cells in the memory array 110.

Figure 2:
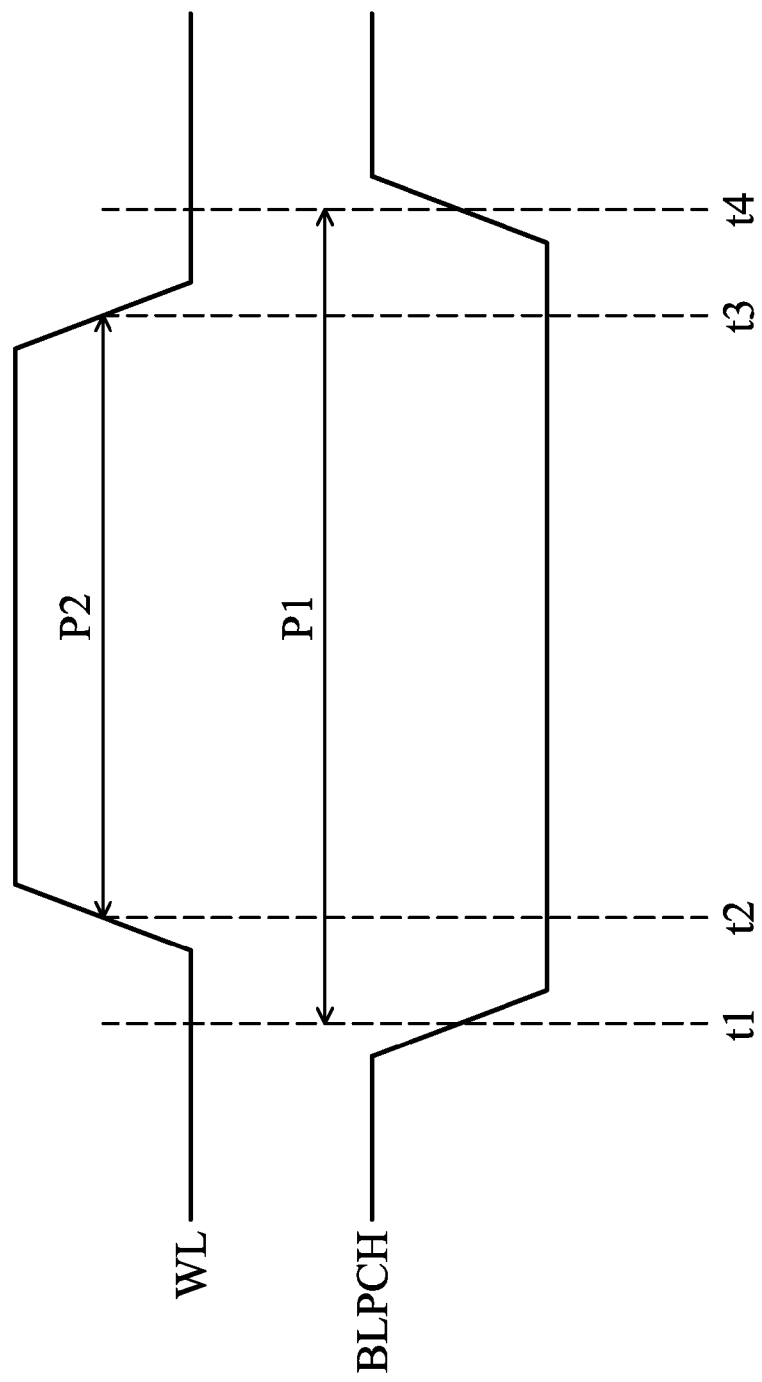
FIG. 2 shows a waveform of the word line signal and the bit line pre-charge signal BLPCH in the SRAM of FIG. 1, in accordance with some embodiments of the disclosure.

FIG. 2 shows a waveform of the word line signal WL and the bit line pre-charge signal BLPCH in the SRAM 100 of FIG. 1, in accordance with some embodiments of the disclosure. The bit line pre-charge signal BLPCH is used to pre-charge the bit lines BL of the memory array 110 in a standby state of the SRAM 100. If the bit line pre-charge signal BLPCH is active (e.g. the bit line pre-charge signal BLPCH is at a high logic level), the bit lines BL of the memory array 110 are pre-charged to a predetermined pre-charge voltage. Conversely, if the bit line pre-charge signal BLPCH is inactive (e.g. the bit line pre-charge signal BLPCH is at a low logic level), the bit lines BL of the memory array 110 are released, and then memory cells of the memory array 110 can be accessed. Specifically, an inactive phase P1 of the bit line pre-charge signal BLPCH must cover an active phase P2 of the word line signals WL, thereby meeting the time margin requirement between a bit line pre-charge time and a word-line enable time for a SRAM. For example, a falling edge (labeled as t1) of the bit line pre-charge signal BLPCH is earlier than a rising edge (labeled as t2) of the word line WL, and a rising edge (labeled as t4) of the bit line pre-charge signal. BLPCH is later than a falling edge (labeled as t3) of the word line WL.

Figure 3:
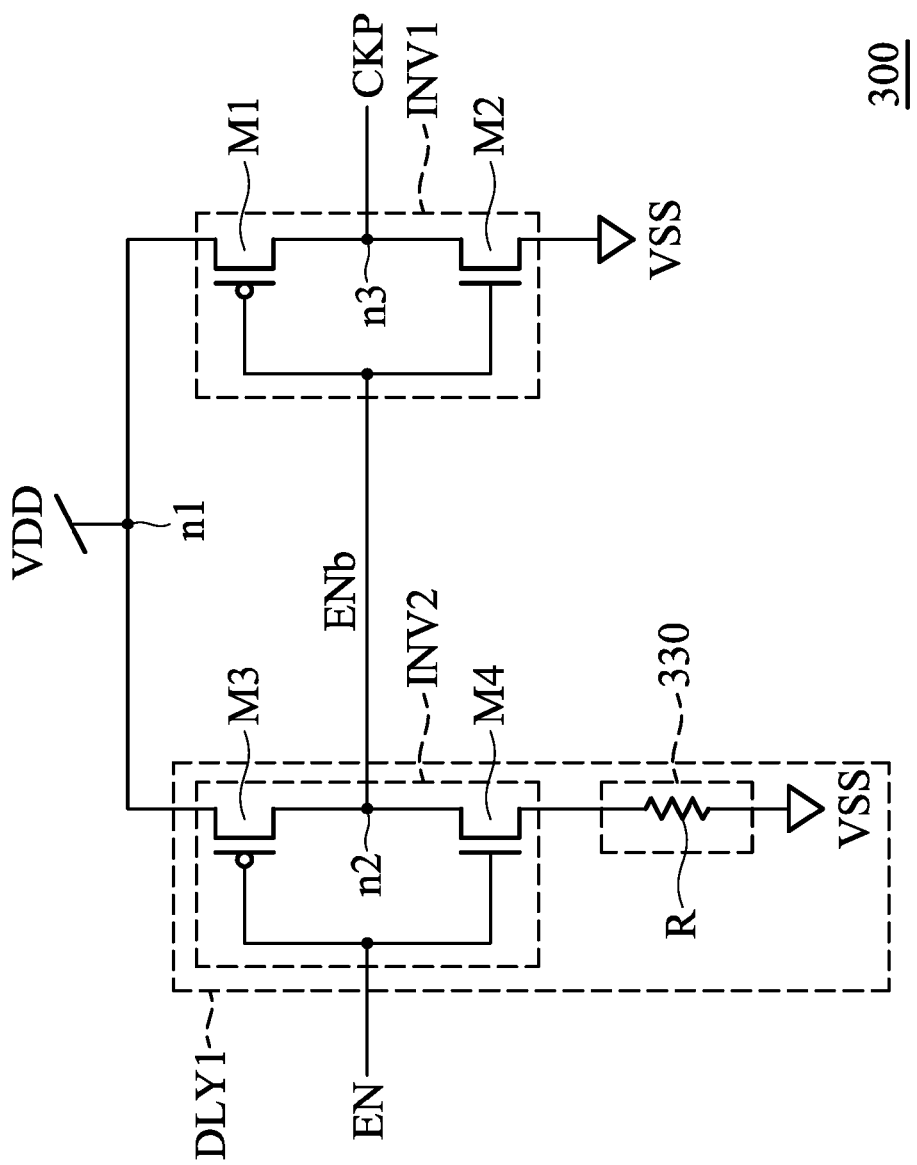
FIG. 3 shows a word-line enable pulse generator, in accordance with some embodiments of the disclosure.

FIG. 3 shows a word-line enable pulse generator 300, in accordance with some embodiments of the disclosure. The word-line enable pulse generator 300 is implemented in a controller or a control circuit (e.g. 130 of FIG. 1) of a SRAM. According to an enable signal EN, the word-line enable pulse generator 300 is capable of providing a word-line enable pulse signal CKP to control a word-line enable time for the SRAM. The word-line enable pulse generator 300 includes a delay unit DLY1 and an inverter INV1. In some embodiments, the enable signal EN is an active-high signal for the SRAM.

The inverter INV1 includes the transistors M1 and M2. The transistor M1 is a PMOS transistor coupled between the nodes n1 and n3, and a gate of the transistor M1 is coupled to a node n2. In the embodiment, the node 1 is coupled to a first power source (e.g. a supply power VDD) of the word-line enable pulse generator 300. The transistor M2 is an NMOS transistor coupled between the node n3 and a second power source (e.g. a ground), and a gate of the transistor M2 is also coupled to the node n2.

The delay unit DLY1 includes the transistors M3 and M4, and a resistance unit 330. The transistor M3 is a PMOS transistor coupled between the nodes n1 and n2, and has a gate for receiving the enable signal EN. In the embodiment, the enable signal EN is an active-high signal for control of a word-line enable time of the SRAM. The transistor M4 is an NMOS transistor coupled between the node n2 and the resistance unit 330, and has a gate coupled to the gate of the transistor M3. The resistance unit 330 includes a resistor R coupled between the transistor M4 and the second power source (e.g. VSS). It should be noted that the resistor R is used as an example, and not to limit the disclosure. In some embodiments, the resistance unit 330 may include a device with a specific impedance (or resistance).

In the delay unit DLY1, the transistors M3 and M4 form an inverter INV2, and the inverter INV2 is coupled to the VSS power source via the resistance unit 330. The inverter INV2 receives the enable signal EN to provide an intermediate signal ENb with a delay time caused by the resistance unit 330, and the intermediate signal ENb is complementary to the enable signal EN. When the resistance of the resistor R is increased, the delay time is increased. Furthermore, the INV1 receives the intermediate signal ENb with the delay time to provide the word-line enable pulse signal CKP.

Figure 4A:
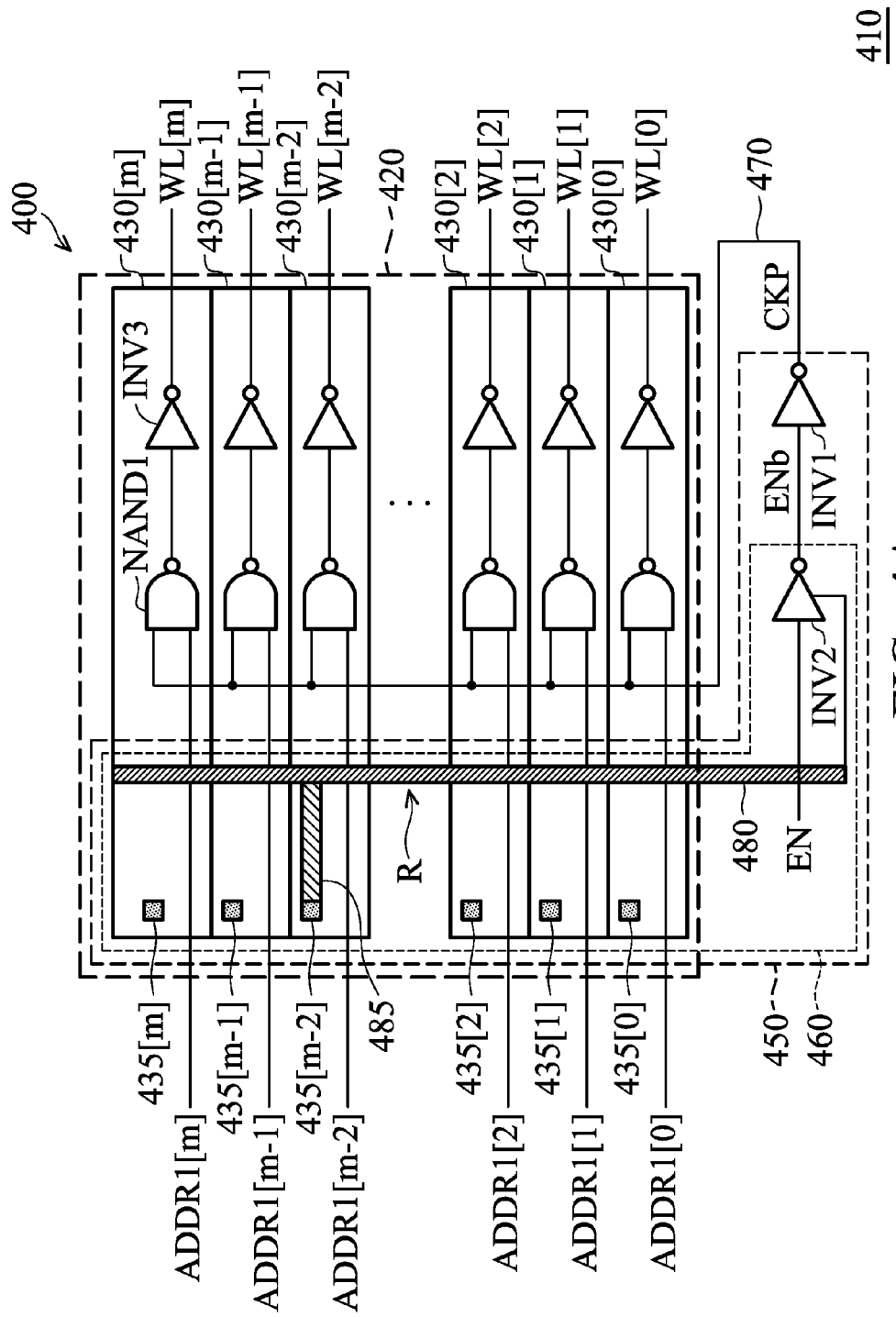
FIG. 4A shows a placement illustrating a SRAM, in accordance with some embodiments of the disclosure.

FIG. 4A shows a placement 410 illustrating a SRAM 400, in accordance with some embodiments of the disclosure. The SRAM 400 includes a word line driving circuit 420 and a word-line enable pulse generator 450. In order to simplify the description, other circuits (e.g. the memory array, the IO circuit, the control circuit and so on) of the SRAM 400 are omitted in FIG. 4A. The word line driving circuit 420 includes a plurality of word line drivers 430[0]-430[m], and the word line drivers 430[0]-430[m] are disposed in parallel in the placement. In some embodiments, the memory array of the SRAM 400 is disposed adjacent to the word line driving circuit 420 in the placement 410.

In the placement 410, each of the word line drivers 430[0]-430[m] includes an NAND gate NAND 1 and an inverter INV3. A first input terminal of the NAND gate NAND1 is coupled to the word-line enable pulse generator 450 for receiving a word-line enable pulse signal CKP. A second input terminal of the NAND gate NAND1 is coupled to a controller of the SRAM for receiving an individual address signal of a pre-decoding address ADDR1. An output terminal of the NAND gate NAND1 is coupled to an input terminal of the inverter INV3. The inverter INV3 receives an output signal of the NAND gate NAND1 and generates an individual word line signal corresponding to the individual address signal, and then provides the individual word line signal to the memory cells of the memory array.

For example, the word line driver 430[0] is configured to receive the word-line enable pulse signal CKP and the address signal ADDR1[0] of the pre-decoding address ADDR1, so as to provide the word line signal WL[0] to the corresponding memory cells in the memory array. Furthermore, the word line driver 430[1] is configured to receive the word-line enable pulse signal CKP and the address signal ADDR1[1] of the pre-decoding address ADDR1, so as to provide the word line signal WL[1] to the corresponding memory cells in the memory array, and so on. It should be noted that the NAND gate NAND1 and the inverter INV3 are used as an example for illustrating the word line driver, and not to limit the disclosure.

The word-line enable pulse generator 450 includes a delay unit 460 and an inverter INV1. As described above, the delay unit 460 includes a resistor R and an inverter INV2. The inverter INV2 is formed by a PMOS transistor and an NMOS transistor, and the resistor R is coupled between the NMOS and the VSS power source. Furthermore, a wire (or trace) 470 is arranged between an output terminal of the inverter INV1 and the first input terminals of the NAND gates NAND1 of the word line drivers 430[0]-430[m], so as to transmit the word-line enable pulse signal CKP from the word-line enable pulse generator 450 to each of the word line drivers 430[0]-430[m].

The inverters INV1 and INV2 are disposed together in a specific area of the placement 410. In some embodiments, the specific area is disposed adjacent to the word line driving circuit 420 in the placement 410. In some embodiments, the resistor R is not disposed in the specific area, and the resistor R is formed by a wire 480 across the word line driving circuit 420. Compared with the wire 470 formed by a low resistance material, the wire 480 is formed by a high resistance material. In some embodiments, the wire 470 is a metal wire formed in a metal layer on a semiconductor substrate, and the wire 480 is a poly wire formed in a poly layer on the semiconductor substrate. In some embodiments, the wire 470 is disposed parallel to the wire 480 in the placement 410.

A first terminal of the resistor R is connected to the inverter INV2 (e.g. a source of the transistor M4 of FIG. 3) in the specific area of the placement 410. A second terminal of the resistor R is connected to a contact of a specific word line driver selected from the word line drivers 430[0]-430[m]. Assuming that specific word line driver is the word line driver 430[m−2], and the second terminal of the resistor is connected to a contact 435_[m−2] in the word line drivers 430_(m−2) via a wire 485. It should be noted that each of the word line drivers 430[0]-430[m] has a contact in its area of the placement 410, and the contact is coupled to a power source in the word line driver. In order to simplify the description, the interconnection between the contact 435_[m−2] and the wires 470 and 485 are omitted in FIG. 4A. In the embodiment, the contacts 435[0]-435[m] of the word line drivers 430[0]-430[m] are coupled to a VSS power source (e.g. a ground). For example, the contact 435[0] is coupled to a VSS power source of the word line driver 430[0], and the contact 435[1] is coupled to a VSS power source of the word line driver 430[1], and so on. In some embodiments, the contacts 435[0]-435[m] of the word line drivers 430[0]-430[m] are coupled to a VDD power source.

It should be noted that the resistance of the resistor R is determined according a length of the wire 480 between the inverter INV2 and the contact 435[m−2]. Specifically, when the length of the wire 480 is increased, the resistance of the resistor R is increased. For example, a first resistance of the resistor R corresponding to the wire 480 coupled between the inverter INV2 and the contact 435[0] of the word line driver 430[0] is less than a second resistance of the resistor R corresponding to the wire 480 coupled between the inverter INV2 and the contact 435[m] of the word line driver 430[m].

Figure 4B:
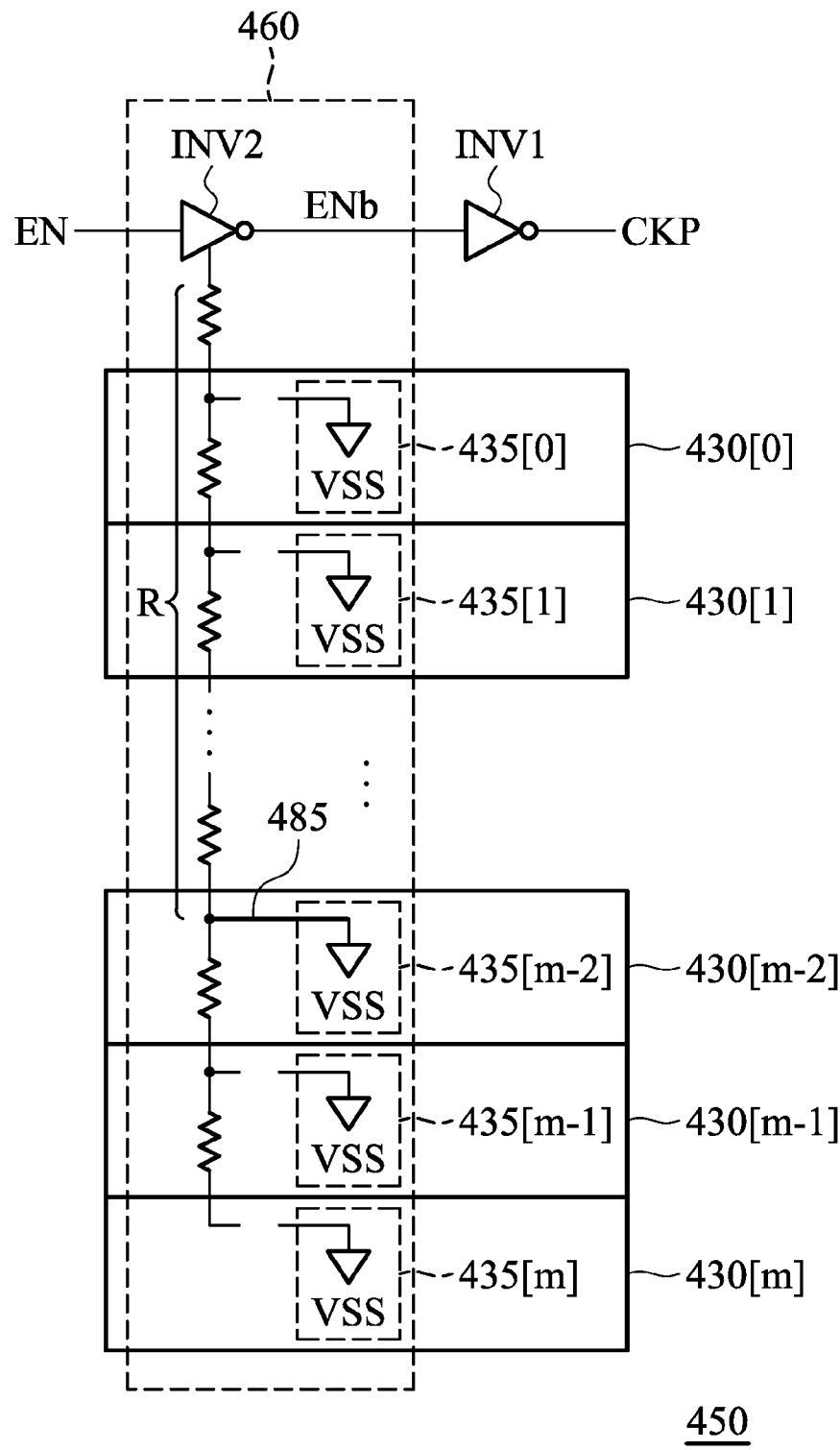
FIG. 4B shows an example circuit of the word-line enable pulse generator of FIG. 4A, in accordance with some embodiments of the disclosure.

FIG. 4B shows an example circuit of the word-line enable pulse generator 450 of FIG. 4A, in accordance with some embodiments of the disclosure. As described above, the resistor R is formed by the wire 480 coupled between the NMOS transistor of the inverter INV2 and the contact 435[m−2] of the word line driver 430[m−2]. Furthermore, the resistor R is coupled to the VSS power source of the word line driver 430[m−2] via the wire 485 and the contact 435[m−2]. In some embodiments, the wire 485 is arranged by a metal programming process performed by a SRAM compiler. Furthermore, which contact is to be connected is determined according to the number of word line drivers of a SRAM.

As described above, the time margin requirement between a bit line pre-charge time and a word-line enable time is important for a SRAM, i.e. an inactive phase (e.g. P1 of FIG. 2) of a bit line pre-charge signal BLPCH must cover an active phase (e.g. P2 of FIG. 2) of a word line signals WL. In general, a small size SRAM has fewer word line drivers. Conversely, a large size SRAM has more word line drivers. Therefore, routings and loadings of the signals to be transmitted to the word line drivers are different for the small size SRAM and the large size SRAM. In other words, the timing of the word-line enable pulse signals CKP are also different between the small size SRAM and the large size SRAM.

For a large size SRAM, the pre-decoding address ADDR1 from the controller (e.g. 130 of FIG. 1) is transmitted to more word line drivers. Compared with the word line drivers disposed at the beginning of the word line driving circuit (e.g. near the word-line enable pulse generator 450), there is more propagation delay when the pre-decoding address ADDR1 is transmitted to the word line drivers disposed at the end of the word line driving circuit (e.g. away from the word-line enable pulse generator 450). Therefore, the word-line enable pulse signal CKP should control an active phase (e.g. P2 of FIG. 2) of a word line signal WL to delay by a longer delay time until the pre-decoding address ADDR1 is ready for the whole word line driver, i.e. the pre-decoding address ADDR1 is completely transmitted to all the word line drivers.

For a small size SRAM, the pre-decoding address ADDR1 from the controller (e.g. 130 of FIG. 1) is transmitted to fewer word line drivers. Compared with the large size SRAM, there is less propagation delay when the pre-decoding address ADDR1 is transmitted to the word line drivers disposed at the end. Similarly, the word-line enable pulse signal CKP should control an active phase (e.g. P2 of FIG. 2) of a word line signal WL to delay by a shorter delay time until the pre-decoding address ADDR1 is ready for all the word line drivers.

Figure 5:
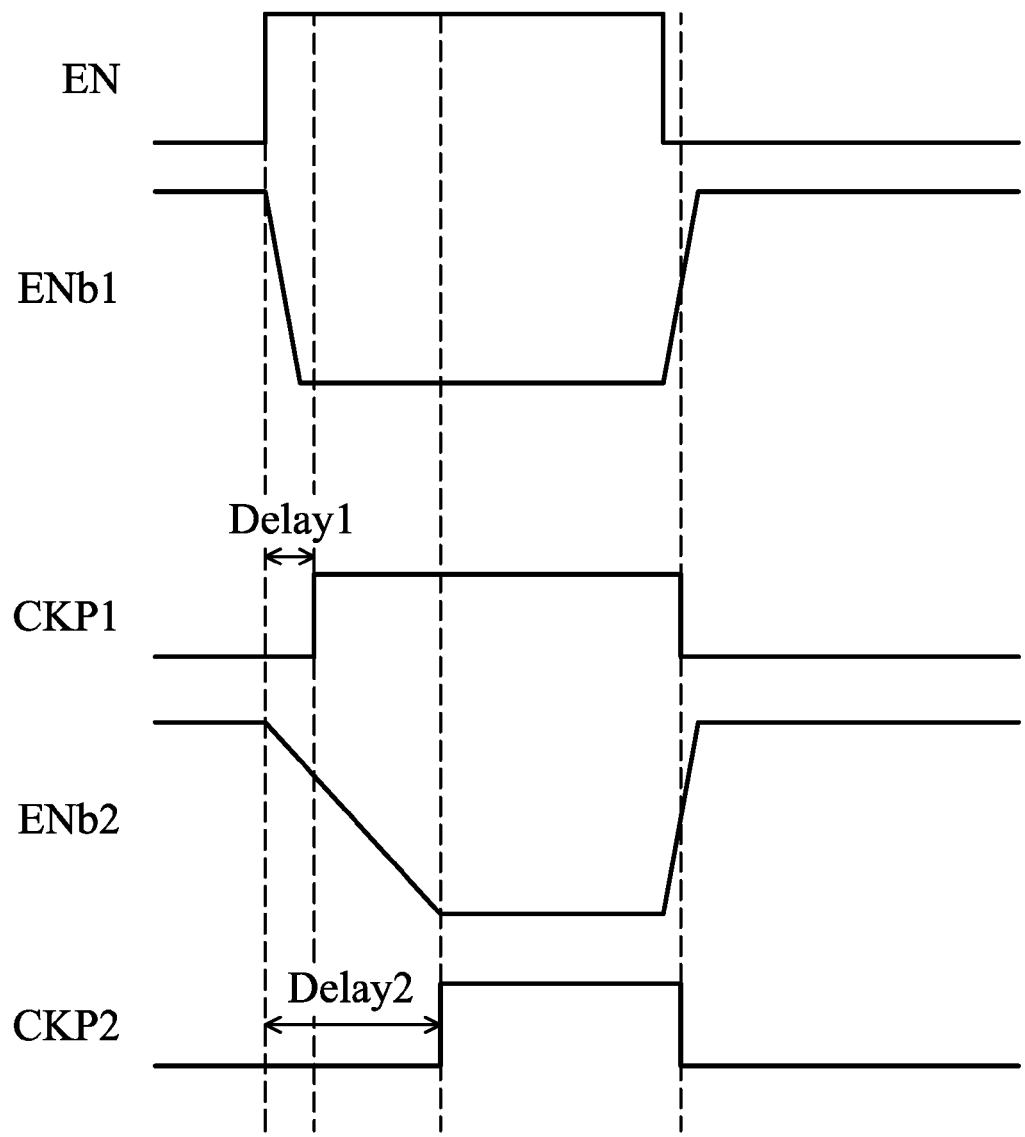
FIG. 5 shows a waveform of word-line enable pulse signals for small and large size SRAMs, in accordance with some embodiments of the disclosure.

FIG. 5 shows a waveform of word-line enable pulse signals for small and large size SRAMs, in accordance with some embodiments of the disclosure. In some embodiments, the small size SRAM and the large size SRAM are implemented in a single integrated circuit (IC). In the embodiment, the enable signal EN is an active-high signal for control of the word-line enable time of both the small size SRAM and the large size SRAM.

The small size SRAM has a first word-line enable pulse generator (e.g. 300 of FIG. 3 or 450 of FIG. 4A) to provide a word-line enable pulse signal CKP1, so as to control a word-line enable time for the small size SRAM. As described above, the first word-line enable pulse generator generates an intermediate signal ENb1, and provides a word-line enable pulse signal CKP1 according to the intermediate signal ENb1. In the embodiment, the word-line enable pulse signal CKP1 is delayed from a rising edge of the enable signal EN by a first delay time Delay1. The first delay time Delay1 is determined according to a first resistance of the resistor (e.g. R of FIG. 3 or FIG. 4A) of the first word-line enable pulse generator. Furthermore, the first resistance of the resistor is determined according to the number of word line drivers in the small size SRAM.

The large size SRAM has a second word-line enable pulse generator (e.g. 300 of FIG. 3 or 450 of FIG. 4A) to provide a word-line enable pulse signal CKP2, so as to control a word-line enable time for the large size SRAM. As described above, the second word-line enable pulse generator generates an intermediate signal ENb2, and provides a word-line enable pulse signal CKP2 according to the intermediate signal ENb2. In the embodiment, the word-line enable pulse signal CKP2 is delayed from a rising edge of the enable signal EN by a second delay time Delay2. The second delay time Delay2 is determined according to a second resistance of the resistor (e.g. R of FIG. 3 or FIG. 4A) of the second word-line enable pulse generator. Furthermore, the second resistance of the resistor is determined according to the number of word line drivers in the large size SRAM. Thus, the second resistance of the resistor of the second word-line enable pulse generator is greater than the first resistance of the resistor of the first word-line enable pulse generator. Therefore, the second delay time Delay2 between the enable signal EN and the word-line enable pulse signal CKP2 is longer than the first delay time Delay1 between the enable signal EN and the word-line enable pulse signal CKP1.

It should be noted that only the rising edges of the word-line enable pulse signals CKP1 and CKP2 are respectively delayed by different delay times (e.g. Delay1 and Delay2). The falling edges of the word-line enable pulse signals CKP1 and CKP2 are synchronous. In other words, the first and second resistances of the first and second word-line enable pulse generators will not affect the falling edges of the word-line enable pulse signals CKP1 and CKP2.

Figure 6:
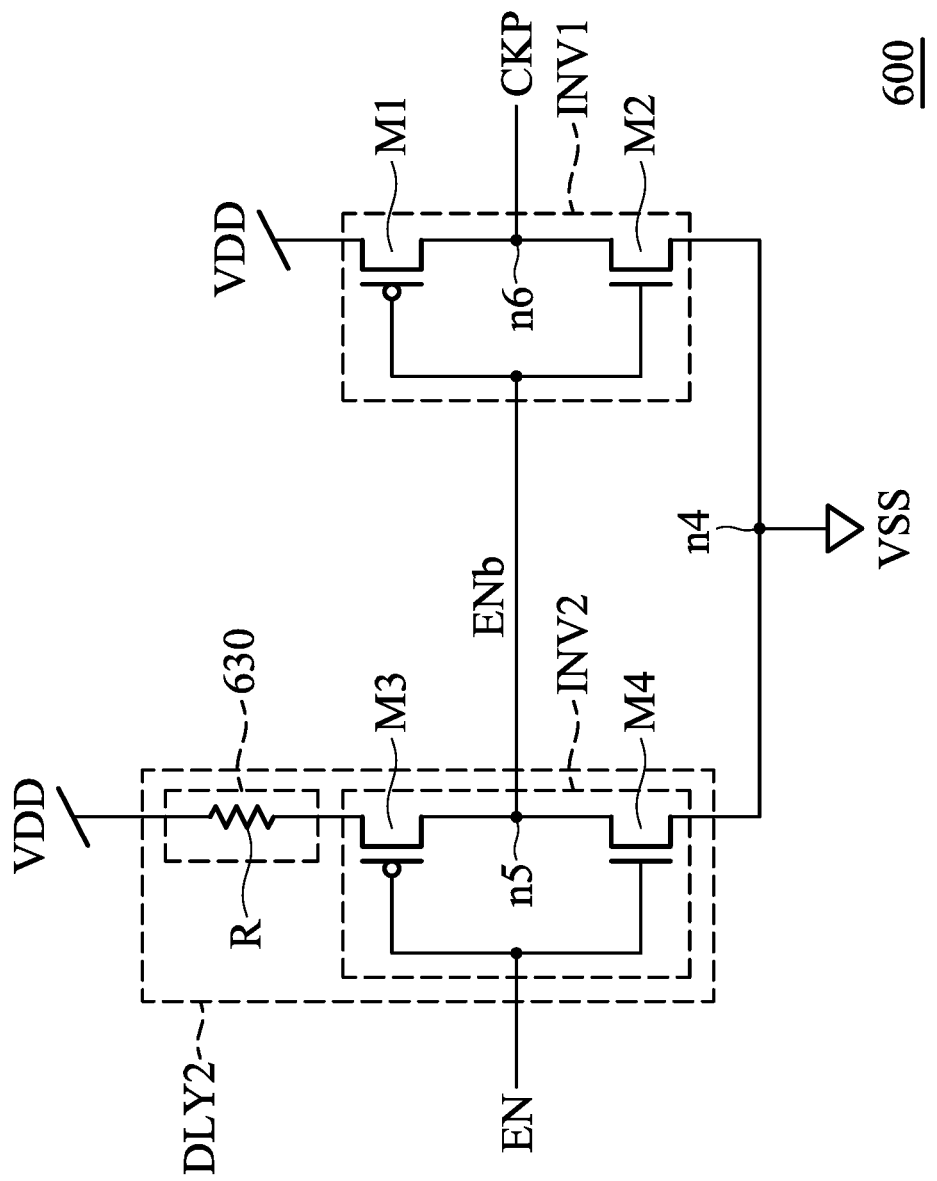
FIG. 6 shows a word-line enable pulse generator, in accordance with some embodiments of the disclosure.

FIG. 6 shows a word-line enable pulse generator 600, in accordance with some embodiments of the disclosure. The word-line enable pulse generator 600 is implemented in a controller of a SRAM (e.g. 130 of FIG. 1). According to an active-low enable signal EN, the word-line enable pulse generator 600 is capable of providing a word-line enable pulse signal CKP to control a word-line enable time for the SRAM. The word-line enable pulse generator 600 includes a delay unit DLY2 and an inverter INV1.

The inverter INV1 includes the transistors M1 and M2. The transistor M1 is a PMOS transistor coupled between a first power source (e.g. a supply power VDD) of the word-line enable pulse generator 600 and a node n6, and a gate of the transistor M1 is coupled to a node n5. The transistor M2 is an NMOS transistor coupled between the nodes n6 and n4, and a gate of the transistor M2 is also coupled to the node n5. In the embodiment, the node 4 is coupled to a second power source (e.g. a ground) of the word-line enable pulse generator 600.

The delay unit DLY2 includes the transistors M3 and M4, and a resistance unit 630. The transistor M3 is a PMOS transistor coupled between the resistance unit 630 and the node n5, and has a gate for receiving the enable signal EN. In the embodiment, the enable signal EN is an active-low signal for controlling the word-line enable time of the SRAM. The transistor M4 is an NMOS transistor coupled between the nodes n5 and n4, and has a gate coupled to the gate of the transistor M3. The resistance unit 630 includes a resistor R coupled between the transistor M3 and the first power source (e.g. VDD). It should be noted that the resistor R is used as an example, and not to limit the disclosure. In some embodiments, the resistance unit 630 may include a device with a specific impedance (or resistance).

In the delay unit DLY2, the transistors M3 and M4 form an inverter INV2, and the inverter INV2 is coupled to the supply power VDD via the resistance unit 630. The inverter INV2 receives the enable signal EN to provide an intermediate signal ENb with a delay time caused by the resistance unit 630, and the intermediate signal ENb is complementary to the enable signal EN. When the resistance of the resistor R is increased, the delay time is increased. Furthermore, the INV1 receives the intermediate signal ENb with the delay time to provide the word-line enable pulse signal CKP. Thus, compared with the enable signal EN, a falling edge of the word-line enable pulse signal CKP is delayed.

Figure 7:
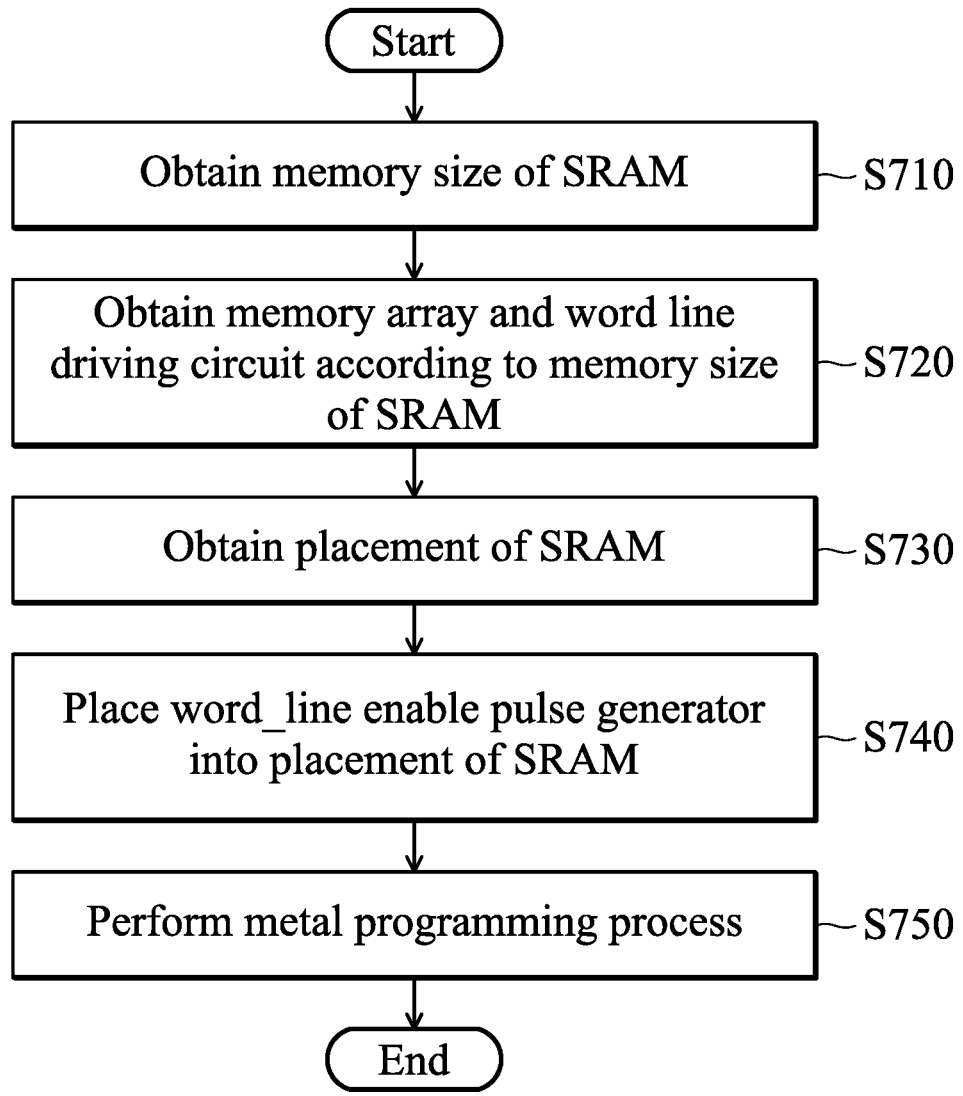
FIG. 7 shows a method for adjusting word-line enable time of a SRAM, in accordance with some embodiments of the disclosure.

FIG. 7 shows a method for adjusting word-line enable time of a SRAM, in accordance with some embodiments of the disclosure. In some embodiments, the method of FIG. 7 is performed by a computer capable of operating an electronic design automation (EDA) tool, such as a SRAM compiler.

First, in operation S710, a processor of the computer obtains information regarding the memory size of an SRAM. In some embodiments, the SRAM is a macro to be implemented in an IC, and the IC may include various SRAM macros.

In operation S720, according to the memory size of the SRAM, the processor obtains a memory array form by a plurality of memory cells, and a word line driving circuit formed by a plurality of word line drivers. In some embodiments, the number of word line drivers is determined according to the memory cells of the memory array.

In operation S730, the processor obtains a placement of the SRAM, and the placement includes the memory array and the word line driving circuit obtained in operation S720.

In operation S740, the processor places a word-line enable pulse generator into the placement of the SRAM. As described above, the word-line enable pulse generator is configured to provide a word-line enable pulse signal to the word line drivers of the word line driving circuit according to an enable signal, so as to control an active phase (e.g. P2 of FIG. 2) of the word line signals WL.

In some embodiments, the word-line enable pulse generator includes a delay unit (e.g. DLY1 of FIG. 3, 450 of FIG. 4A, or DLY2 of FIG. 6) and a first inverter (e.g. INV1 of FIG. 3, FIG. 4A or FIG. 6). The delay unit includes a second inverter (e.g. INV2 of FIG. 3, FIG. 4A or FIG. 6) and a resistance unit (e.g. 330 of FIG. 3 or 630 of FIG. 6). In some embodiments, the resistance unit includes a resistor (e.g. R of FIG. 3, FIG. 4A or FIG. 6).

In operation S750, the processor performs a metal programming process to form a high resistance wire across a portion of the word line drivers in the placement of the SRAM. The resistor of the resistance unit is formed by the high resistance wire.

According to the placement of the SRAM, the SRAM can be fabricated by various semiconductor processes.

In the metal programming process, the resistance of the resistor is determined according to the number of word line drivers in the word line driving circuit. Furthermore, a length of the high resistance wire is determined according to the resistance of the resistor. In some embodiments, a unit resistance value of the high resistance wire is obtained, and a target resistance of the resistor is calculated by simulation, so as to obtain the optimized length of the high resistance wire.

After the length of the high resistance wire is determined. According to the length of the high resistance wire, the processor connects a first terminal of the high resistance wire to the second inverter (e.g. the source of the transistor M4 of FIG. 3 or the source of the transistor M3 of FIG. 6) of the delay unit. The processor further connects a second terminal of the high resistance wire to a power source via a contact of a specific word line driver selected from the word line drivers.

If the enable signal is an active-high signal, a rising edge of the word-line enable pulse signal is delayed from a rising edge of the enable signal by a delay time corresponding to the resistance of the resistor in the delay unit. Furthermore, the second terminal of the high resistance wire is coupled to a VSS power source via the contact of the specific word line driver.

If the enable signal is an active-low signal, a falling edge of the word-line enable pulse signal is delayed from a falling edge of the enable signal by the delay time corresponding to the resistance of the resistor in the delay unit. Furthermore, the second terminal of the high resistance wire is coupled to a VDD power source via the contact of the specific word line driver.

Figure 8:
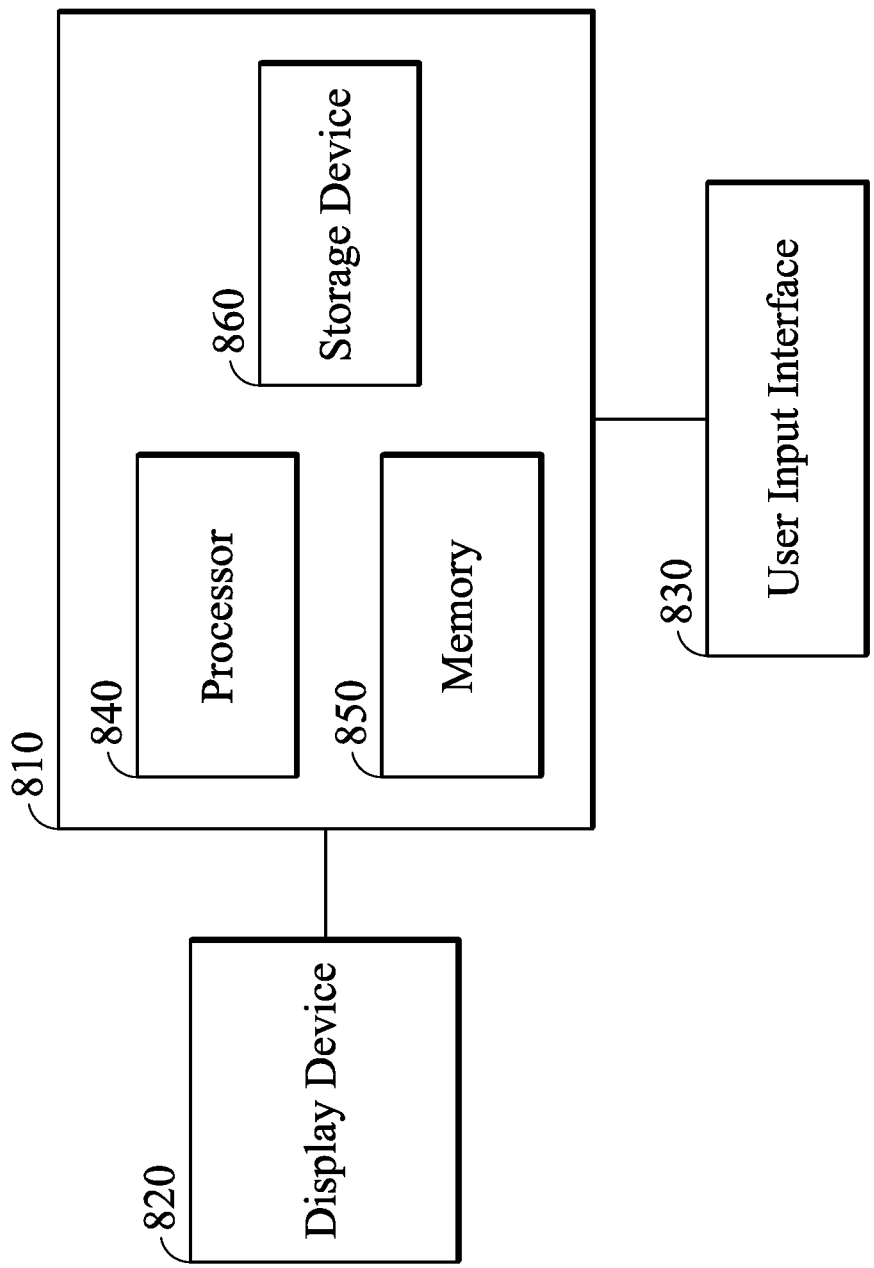
FIG. 8 shows a computer system, in accordance with some embodiments of the disclosure.

FIG. 8 shows a computer system 800, in accordance with some embodiments of the disclosure. The computer system 800 includes a computer 810, a display device 820 and a user input interface 830, wherein the computer 810 includes a processor 840, a memory 850, and a storage device 860. The computer 810 is coupled to the display device 820 and the user input interface 830, wherein the computer 810 is capable of operating an electronic design automation (EDA) tool. Furthermore, the computer 810 is capable of receiving the information regarding the memory size of the SRAM from the user input interface 830 and displaying the placement of the SRAM on the display device 820. In some embodiments, the display device 820 is a GUI for the computer 810. Furthermore, the display device 820 and the user input interface 830 can be implemented in the computer 810. The user input interface 830 may be a keyboard, a mouse and so on. In the computer 810, the storage device 860 can store the operating systems (OSs), applications, and data that include input required by the applications (e.g. SRAM compiler) and/or output generated by applications. In some embodiments, information (e.g. layout or placement) regarding various memory arrays and various word line driving circuits are stored in the storage device 860 or the memory 850. The processor 840 of the computer 810 can perform one or more operations (either automatically or with user input) in any method that is implicitly or explicitly described in this disclosure. For example, in response to the information regarding the memory size of the SRAM, the processor 840 can select the suitable memory array and the word line driving circuit from the storage device 860 or the memory 850. Furthermore, during operation, the processor 840 can load the applications of the storage device 860 into the memory 850, and then the applications can be used by a user to create, view, and/or edit the placement for a SRAM design.

Embodiments of adjusting word-line enable time of a SRAM are provided. A metal programming process is performed to determine the resistance of a resistance unit in a word-line enable pulse generator according to the number of word line drivers of the SRAM. Thus, a resistor of the resistance unit is formed by a high resistance wire across a portion of the word line drivers in the placement of the SRAM. Therefore, timing of a word-line enable pulse signal CKP can be controlled automatically, thereby decreasing maintenance time and man power to adjust a word-line enable time for a SRAM.

In some embodiments, a reference circuit for a magnetic random access memory (MRAM) is provided. The reference circuit includes a plurality of device strings coupled in parallel. Each of the device strings includes a plurality of magnetic tunnel junction (MTJ) devices coupled in serial. The quantity of MTJ devices of each of the device strings is equal to the quantity of device strings. The equivalent resistance of the MTJ devices is equal to the resistance of one of the MTJ devices.

In some embodiments, a word-line enable pulse generator for a SRAM is provided. The word-line enable pulse generator includes a delay unit and a first inverter. The delay unit receives an enable signal to provide an intermediate signal. The first inverter receives the intermediate signal to provide a word-line enable pulse signal to a plurality of word line drivers of the SRAM. The delay unit includes a first transistor coupled between an input terminal of the first inverter and a first power source, a resistor coupled between the input terminal of the first inverter and a second power source that is different from the first power source, and a second transistor coupled between the input terminal of the first inverter and the resistor. The first transistor has a gate for receiving the enable signal. The first transistor and the second transistor form a second inverter, and a specific edge of the word-line enable pulse signal is delayed from the specific edge of the enable signal by a delay time corresponding to the resistance of the resistor.

In some embodiments, a SRAM is provided. The SRAM includes a memory array including a plurality of memory cells, a word line driving circuit coupled to the memory array, and a word-line enable pulse generator. The word line driving circuit includes a plurality of word line drivers. Each of the word line drivers provides an individual word line signal corresponding to a pre-decoding address to the memory array in response to a word-line enable pulse signal. The word-line enable pulse generator provides the word-line enable pulse signal to the word line drivers via a first wire according to an enable signal. The word-line enable pulse signal is delayed from the enable signal by a delay time, and the delay time is determined according to the number of word line drivers.

In some embodiments, a method for adjusting word-line enable time of a SRAM is provided. A memory array formed by a plurality of memory cells is obtained according to the memory size of the SRAM. A placement of the SRAM is obtained, wherein the placement of the SRAM includes a word line driving circuit including a plurality of word line drivers disposed in parallel and the memory array adjacent to the word line driving circuit. A word-line enable pulse generator is placed into the placement of the SRAM, wherein the word-line enable pulse generator is configured to provide a word-line enable pulse signal to the word line drivers of the word line driving circuit according to an enable signal. The word-line enable pulse generator includes a delay unit receiving the enable signal to provide an intermediate signal, and a first inverter receiving the intermediate signal to provide the word-line enable pulse signal. The delay unit includes a first transistor coupled between an input terminal of the first inverter and a first node, having a gate for receiving the enable signal, a resistor coupled between the input terminal of the first inverter and a second node, and a second transistor coupled between the input terminal of the first inverter and the resistor, wherein the first transistor and the second transistor form a second inverter. A metal programming process is performed to form a high resistance wire across a portion of the word line drivers in the placement of the SRAM, wherein the resistor of the delay unit is formed by the high resistance wire a specific edge of the word-line enable pulse signal is delayed from the specific edge of the enable signal by a delay time corresponding to the resistance of the resistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A word-line enable pulse generator for a static random access memory (SRAM), comprising:
    a delay unit, receiving an enable signal to provide an intermediate signal; and
    a first inverter, receiving the intermediate signal to provide a word-line enable pulse signal to a plurality of word line drivers of the SRAM,
    wherein the delay unit comprises:
    a first transistor coupled between an input terminal of the first inverter and a first power source, having a gate for receiving the enable signal;
    a resistor coupled between the input terminal of the first inverter and a second power source that is different from the first power source; and
    a second transistor coupled between the input terminal of the first inverter and the resistor,
    wherein the first transistor and the second transistor form a second inverter, and a specific edge of the word-line enable pulse signal is delayed from a specific edge of the enable signal by a delay time corresponding to a resistance of the resistor.

2. The word-line enable pulse generator as claimed in claim 1, wherein the resistance of the resistor is determined according to the number of the word line drivers.

3. The word-line enable pulse generator as claimed in claim 1,
wherein when the enable signal is an active-high signal, the first power source is higher than the second power source, wherein the first transistor is a PMOS transistor and the second transistor is an NMOS transistor, wherein the specific edges of the word-line enable pulse signal and the enable signal are rising edges.

4. The word-line enable pulse generator as claimed in claim 1, wherein when the enable signal is an active-low signal, the first power source is lower than the second power source, wherein the first transistor is an NMOS transistor and the second transistor is a PMOS transistor, wherein the specific edges of the word-line enable pulse signal and the enable signal are falling edges.

5. The word-line enable pulse generator as claimed in claim 1, wherein the resistor is formed by a wire.

6. A static random access memory (SRAM), comprising:
a memory array comprising a plurality of memory cells;
a word line driving circuit coupled to the memory array, comprising:
a plurality of word line drivers, each providing an individual word line signal corresponding to a pre-decoding address to the memory array in response to a word-line enable pulse signal; and
a word-line enable pulse generator, providing the word-line enable pulse signal to the word line drivers via a first wire according to an enable signal,
wherein a specific edge of the word-line enable pulse signal is delayed from a specific edge of the enable signal by a delay time corresponding to a resistor of the word-line enable pulse generator, and the delay time is determined according to the number of the word line drivers, and the resistor is formed by a second wire parallel to the first wire.

7. The SRAM as claimed in claim 6, wherein each of the word line drivers comprises:
a NAND gate configured to receive the word-line enable pulse signal and an individual address signal of the pre-decoding address; and
an inverter configured to receive an output signal of the NAND gate and provide the individual word line signal.

8. The SRAM as claimed in claim 6, wherein the word-line enable pulse generator comprises:
a delay unit, receiving the enable signal to provide an intermediate signal; and
a first inverter, receiving the intermediate signal to provide the word-line enable pulse signal,
wherein the delay unit comprises:
a first transistor coupled between an input terminal of the first inverter and a first node, having a gate for receiving the enable signal;
the resistor coupled between the input terminal of the first inverter and a second node; and
a second transistor coupled between the input terminal of the first inverter and the resistor,
wherein a resistance of the resistor is determined according to the number of the word line drivers, and the first transistor and the second transistor form a second inverter.

9. The SRAM as claimed in claim 8, wherein the word line drivers are disposed in parallel in a placement, and the resistor is formed by the second wire across a portion of the word line drivers.

10. The SRAM as claimed in claim 9, wherein a first terminal of the second wire is coupled to a source of the second transistor, and a second terminal of the second wire is coupled to a power source of one of the word line drivers.

11. The SRAM as claimed in claim 9, wherein the first wire is formed by a metal layer in the placement, and the second wire is formed by a poly layer in the placement.

12. The SRAM as claimed in claim 8, wherein when the enable signal is an active-high signal, the first transistor is a PMOS transistor and the second transistor is an NMOS transistor, wherein the first node is coupled to a power supply of the first inverter, and the second node is coupled to a ground terminal of one of the word line drivers wherein the specific edges of the word-line enable pulse signal and the enable signal are rising edges.

13. The SRAM as claimed in claim 8, wherein when the enable signal is an active-low signal, the first transistor is an NMOS transistor and the second transistor is a PMOS transistor, wherein the second node is coupled to a power supply of one of the word line drivers, and the first node is coupled to a ground of first inverter, wherein the specific edges of the word-line enable pulse signal and the enable signal are falling edges.

14. A method for adjusting word-line enable time of a static random access memory (SRAM), comprising:
obtaining a memory array formed by a plurality of memory cells according to memory size of the SRAM;
obtaining a placement of the SRAM according to the memory array, wherein the placement of the SRAM comprises a word line driving circuit comprising a plurality of word line drivers disposed in parallel and the memory array adjacent to the word line driving circuit;
placing a word-line enable pulse generator into the placement of the SRAM, wherein the word-line enable pulse generator is configured to provide a word-line enable pulse signal to the word line drivers of the word line driving circuit according to an enable signal, and the word-line enable pulse generator comprises:
a delay unit, receiving the enable signal to provide an intermediate signal; and
a first inverter, receiving the intermediate signal to provide the word-line enable pulse signal,
wherein the delay unit comprises:
a first transistor coupled between an input terminal of the first inverter and a first node, having a gate for receiving the enable signal;
a resistor coupled between the input terminal of the first inverter and a second node; and
a second transistor coupled between the input terminal of the first inverter and the resistor, wherein the first transistor and the second transistor form a second inverter; and
performing a metal programming process to form a wire across a portion of the word line drivers in the placement of the SRAM, wherein the resistor of the delay unit is formed by the wire,
wherein a specific edge of the word-line enable pulse signal is delayed from a specific edge of the enable signal by a delay time corresponding to a resistance of the resistor.

15. The method as claimed in claim 14, wherein the step of performing the metal programming process to form the wire across the portion of the word line drivers in the placement of the SRAM further comprises:
determining the resistance of the resistor according to the number of the word line drivers; and
determining a length of the wire according to the resistance of the resistor.

16. The method as claimed in claim 15, wherein the step of determining the length of the wire according to the resistance of the resistor further comprises:
coupling a first terminal of the wire to a source of the second transistor; and
coupling a second terminal of the wire to a power source of one of the word line drivers.

17. The method as claimed in claim 16, wherein when the enable signal is an active-high signal, the first transistor is a PMOS transistor and the second transistor is an NMOS transistor, wherein the first node is coupled to a power supply of the first inverter, and the second node is coupled to a ground of the one of the word line drivers.

18. The method as claimed in claim 16, wherein when the enable signal is an active-low signal, the first transistor is an NMOS transistor and the second transistor is a PMOS transistor, wherein the node is coupled to a power supply of the one of the word line drivers, and the first node is coupled to a ground of the first inverter.

19. The method as claimed in claim 14, wherein when the enable signal is an active-high signal, the specific edges of the word-line enable pulse signal and the enable signal are rising edges, and when the enable signal is an active-low signal, the specific edges of the word-line enable pulse signal and the enable signal are falling edges.

20. The method as claimed in claim 14, wherein when the number of word line drivers is increased, the resistance of the resistor and the length of the wire are increased, and when the number of word line drivers is decreased, the resistance of the resistor and the length of the wire are decreased.

* * * * *